United States Patent
Jacobs et al.

(10) Patent No.: US 8,416,383 B2
(45) Date of Patent: Apr. 9, 2013

(54) LITHOGRAPHIC APPARATUS AND METHOD

(75) Inventors: Hernes Jacobs, Rossum (NL); Eva Mondt, Eindhoven (NL); Alexander Nikolov Zdravkov, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 1129 days.

(21) Appl. No.: 11/987,009

(22) Filed: Nov. 26, 2007

(65) Prior Publication Data

US 2008/0165331 A1 Jul. 10, 2008

Related U.S. Application Data (60) Provisional application No. 60/874,482, filed on Dec. 13, 2006.

(51) Int. Cl.
G03B 27/52 (2006.01)
G03B 27/58 (2006.01)
G03B 27/32 (2006.01)
G03B 27/42 (2006.01)
G03B 27/60 (2006.01)

(52) U.S. Cl. .......... 355/30; 355/53; 355/72; 355/73; 355/74; 355/77

(58) Field of Classification Search .......... 355/30, 355/52, 53, 72–74, 77; 250/492.1, 492.2, 250/492.22, 548; 430/311, 312; 49/303, 49/310; 429/78; 418/104; 277/500, 507
See application file for complete search history.

(56) References Cited

U.S. PATENT DOCUMENTS

| 4,509,852 A | 4/1985 | Tabarelli et al. ........... 355/30 |
| 4,742,797 A * | 5/1988 | Barker ...................... 399/105 |
| 6,059,879 A * | 5/2000 | Gonzalez ................... 117/92 |
| 6,136,163 A * | 10/2000 | Cheung et al. ............ 204/198 |
| 6,461,155 B1 * | 10/2002 | Settles ...................... 432/247 |
| 6,680,774 B1 * | 1/2004 | Heinle ....................... 355/72 |
| 7,199,858 B2 | 4/2007 | Lof et al. .................. 355/30 |
| 2002/0072014 A1 * | 6/2002 | Schiltz ..................... 430/312 |
| 2004/0136494 A1 | 7/2004 | Lof et al. .................. 378/34 |
| 2004/0160582 A1 * | 8/2004 | Lof et al. .................. 355/30 |
| 2004/0207824 A1 | 10/2004 | Lof et al. .................. 355/30 |
| 2005/0122505 A1 * | 6/2005 | Miyajima ................. 355/72 |

(Continued)

FOREIGN PATENT DOCUMENTS

| EP | 1 420 300 A2 | 5/2004 |
| EP | 1 429 188 | 6/2004 |

(Continued)

OTHER PUBLICATIONS

Lin, Burn J., "Lithography for 32nm Half-Pitch," TSMC, Inc., Jul. 2006, pp. 1-39.

(Continued)

*Primary Examiner* — Toan Ton
*Assistant Examiner* — Christina Riddle
(74) *Attorney, Agent, or Firm* — Pillsbury Winthrop Shaw Pittman LLP (57) ABSTRACT

A lithographic apparatus is disclosed that includes a seal provided in a substrate table, the seal being actuatable from an open configuration to a closed configuration, the closed configuration being such that when a substrate is located on the substrate table, the seal closes a gap between the substrate and the substrate table.

22 Claims, 6 Drawing Sheets

U.S. PATENT DOCUMENTS

| | | | |
|---|---|---|---|
| 2005/0286033 A1* | 12/2005 | Lin et al. | 355/53 |
| 2006/0033892 A1* | 2/2006 | Cadee et al. | 355/30 |
| 2006/0033898 A1* | 2/2006 | Cadee et al. | 355/53 |
| 2006/0139614 A1* | 6/2006 | Owa et al. | 355/72 |
| 2007/0008508 A1 | 1/2007 | Lin et al. | 355/53 |
| 2007/0115450 A1 | 5/2007 | Nagasaka et al. | |
| 2007/0126999 A1* | 6/2007 | Poon et al. | 355/30 |
| 2007/0229786 A1* | 10/2007 | Kemper et al. | 355/53 |

FOREIGN PATENT DOCUMENTS

| | | |
|---|---|---|
| EP | 1 420 300 A3 | 8/2005 |
| JP | 2004-289127 | 10/2004 |
| JP | 2005-191557 | 7/2005 |
| JP | 2006-120889 | 5/2006 |
| JP | 2006-173527 | 6/2006 |
| JP | 2006-202825 | 8/2006 |
| JP | 2006-237255 | 9/2006 |
| JP | 2007-142168 | 6/2007 |
| WO | WO 99/49504 | 9/1999 |

OTHER PUBLICATIONS

Japanese Office Action mailed Nov. 15, 2010 in corresponding Japanese Patent Application No. 2007-315494.

* cited by examiner

LITHOGRAPHIC APPARATUS AND METHOD

This non-provisional application claims the benefit of and priority to U.S. Provisional Application No. 60/874,482, filed Dec. 13, 2006, the entire contents of which application is hereby incorporated by reference.

FIELD

The present invention relates to a lithographic apparatus and method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective numerical aperature (NA) of the system and also increasing the depth of focus.) Other immersion liquids have been proposed, including water with solid particles (e.g. quartz) suspended therein.

However, submersing the substrate or substrate and substrate table in a bath of liquid (see, for example, U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

Figure 2:
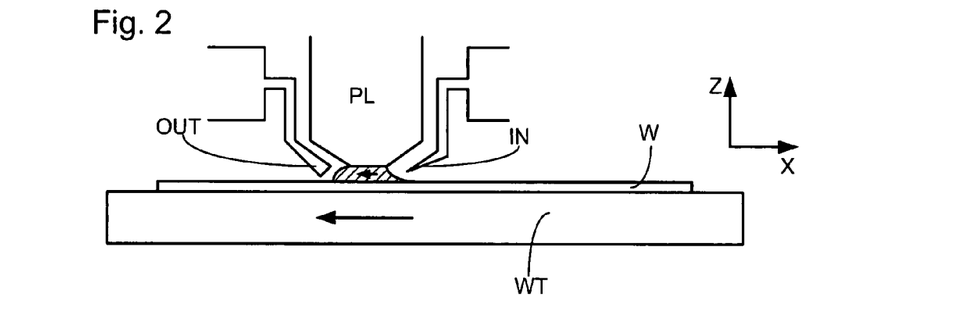
FIGS. 2 and 3 depict a liquid supply system for use in a lithographic apparatus.
Figure 3:
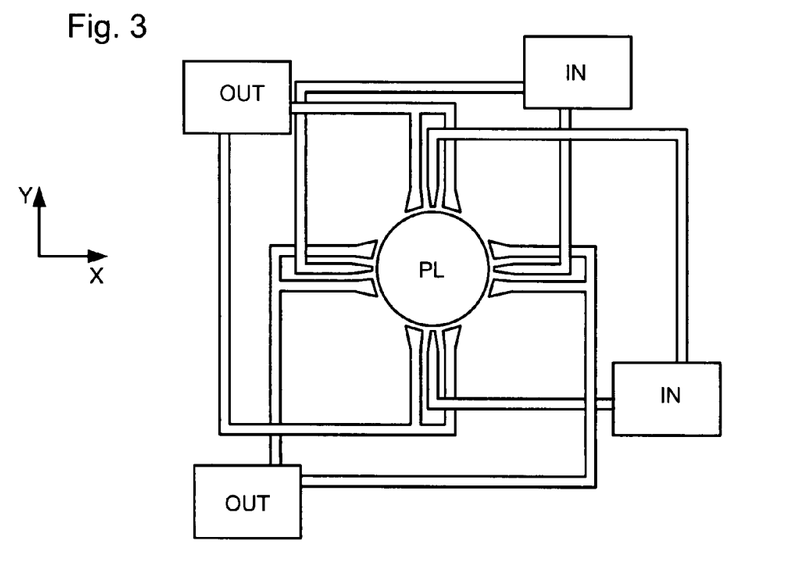

One of the solutions proposed is for a liquid supply system to provide liquid on only a localized area of the substrate and in between the final element of the projection system and the substrate (the substrate generally has a larger surface area than the final element of the projection system). One way which has been proposed to arrange for this is disclosed in PCT patent application publication no. WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

SUMMARY

Gas may pass into the immersion liquid. Where this occurs the gas may cause distortion of the pattern projected onto the substrate.

It is advantageous, for example, to provide a lithographic apparatus and method which may reduce the passage of gas into the liquid, or may reduce contamination of the liquid.

According to an aspect of the invention, there is provided a lithographic apparatus, comprising a substrate table arranged to hold a substrate, a projection system configured to project a patterned beam of radiation onto the substrate, a liquid supply system configured to provide a liquid to a space between the projection system and the substrate table, and a seal provided in the substrate table, the seal being actuatable from an open configuration to a closed configuration, the closed configuration being such that when a substrate is located on the substrate table, the seal substantially closes a gap between the substrate and the substrate table.

According to an aspect of the invention, there is provided a substrate table arranged to hold a lithographic substrate, a seal being provided in the substrate table, the seal being actuatable from an open configuration to a closed configuration, the closed configuration being such that when a substrate is located on the substrate table, the seal substantially closes a gap between the substrate and the substrate table.

According to an aspect of the invention, there is provided a lithographic method comprising providing a substrate on substrate table, actuating a rotatable ring and lip such that they substantially close a gap between the substrate and the substrate table, providing a liquid to a space between a projection system and the substrate table, projecting a pattern onto the substrate via the projection system, actuating the rotatable ring such that the gap between the substrate and the substrate table is reopened, and removing the substrate from the substrate table.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
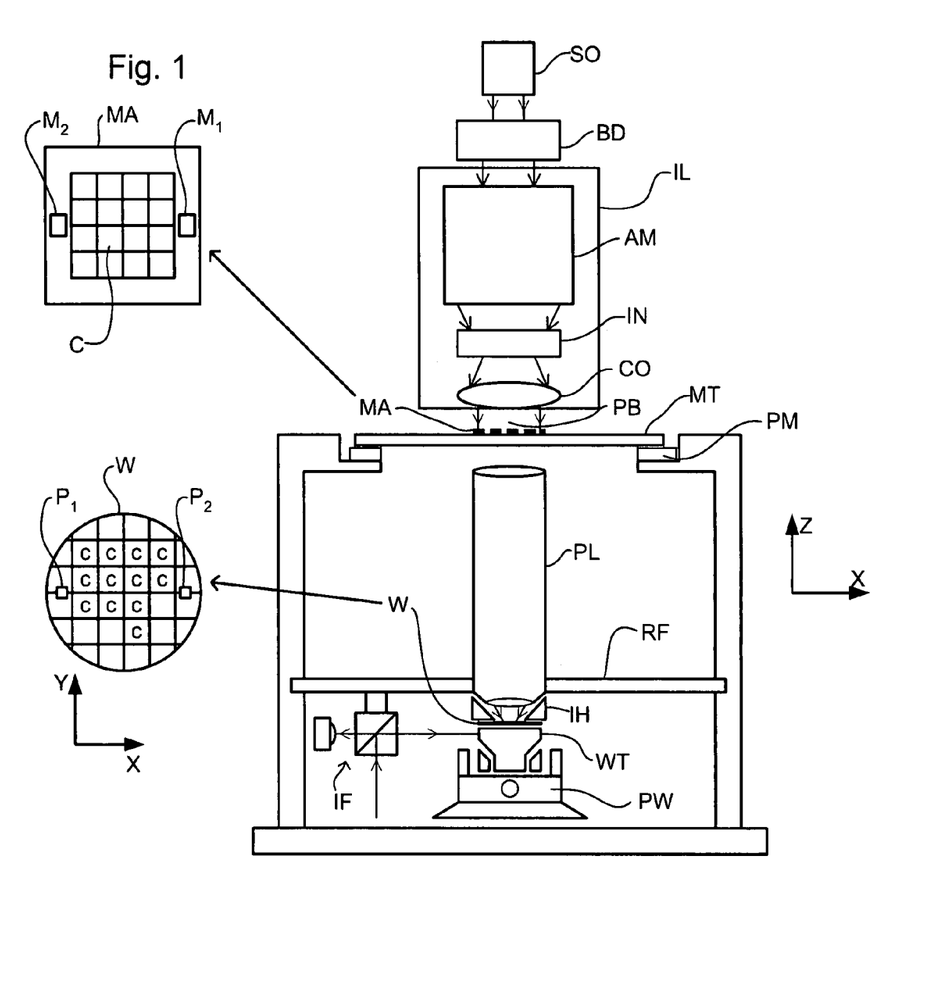
FIG. 1 depicts a lithographic apparatus to which an embodiment of the invention may be applied.

FIG. 1 schematically depicts a lithographic apparatus to which the invention may be applied. The apparatus comprises:

an illumination system (illuminator) IL configured to condition a radiation beam PB (e.g. UV radiation or DUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PL configured to project a pattern imparted to the radiation beam PB by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines the additional tables or support structures may be used in parallel, or preparatory steps may be carried out on one or more tables or support structures while one or more other tables or support structures are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam PB is incident on the patterning device (e.g., mask) MA, which is held on the support structure (e.g., mask table) MT, and is patterned by the patterning device. Having traversed the patterning device MA, the radiation beam PB passes through the projection system PL, which focuses the beam onto a target portion C of the substrate W. An immersion hood IH (including a liquid confinement structure), which is described further below, supplies immersion liquid to a space between the final element of the projection system PL and the substrate W.

With the aid of the second positioner PW and position sensor IF (e.g. an interferometric device, linear encoder or capacitive sensor), the substrate table WT can be moved accurately, e.g. so as to position different target portions C in the path of the radiation beam PB. Similarly, the first positioner PM and another position sensor (which is not explicitly depicted in FIG. 1) can be used to accurately position the patterning device MA with respect to the path of the radiation beam PB, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In European patent application publication no. EP 1420300 and United States patent application publication no. US 2004-0136494, each hereby incorporated in their entirety by reference, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table. An embodiment of the invention may be applied to such a dual stage immersion lithography apparatus.

Figure 4:
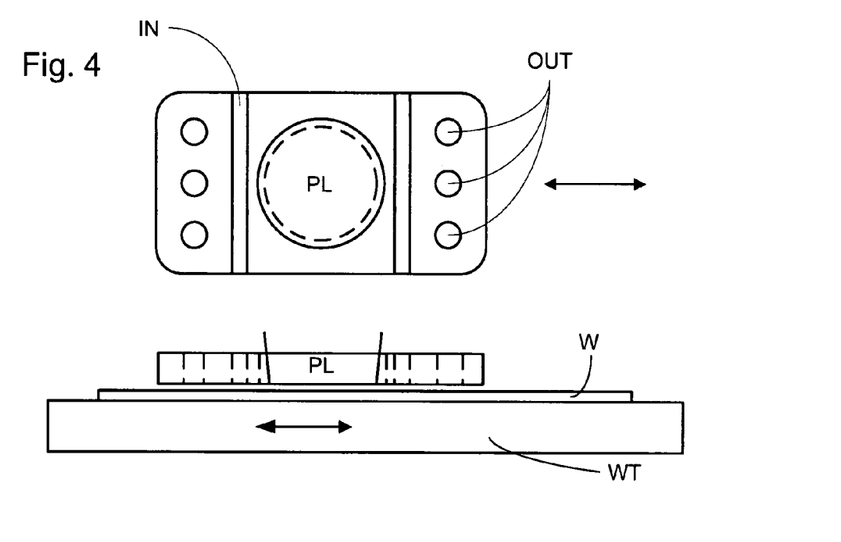
FIG. 4 depicts another liquid supply system for use in a lithographic apparatus.

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

Figure 5:
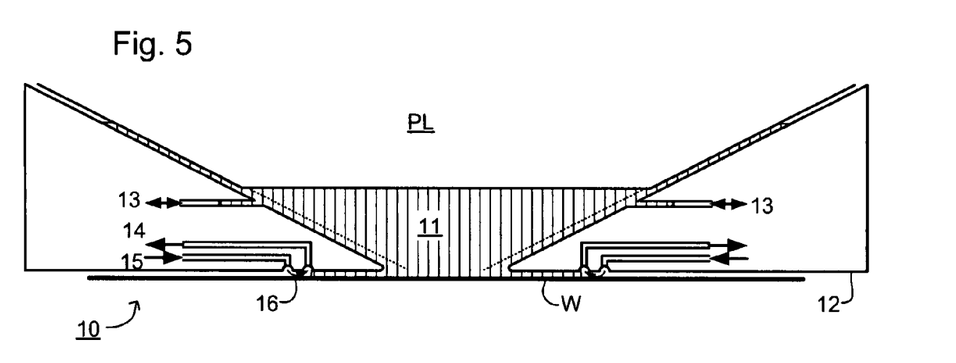
FIG. 5 depicts another liquid supply system for use in a lithographic apparatus.

Another immersion lithography solution with a localized liquid supply system solution which has been proposed is to provide the liquid supply system with a liquid confinement structure which extends along at least a part of a boundary of the space between the final element of the projection system and the substrate table. Such a solution is illustrated in FIG. 5. The liquid confinement structure is substantially stationary relative to the projection system in the XY plane though there may be some relative movement in the Z direction (in the direction of the optical axis). In an embodiment, a seal is formed between the liquid confinement structure and the surface of the substrate and may be a contactless seal such as a gas seal.

A liquid confinement structure 12 at least partly contains liquid in the space 11 between a final element of the projection system PL and the substrate W. A contactless seal 16 to the substrate may be formed around the image field of the projection system so that liquid is confined within the space between the substrate surface and the final element of the projection system. The space is at least partly formed by the liquid confinement structure 12 positioned below and surrounding the final element of the projection system PL. Liquid is brought into the space below the projection system and within the liquid confinement structure 12 by liquid inlet 13 and may be removed by liquid outlet 13. The liquid confinement structure 12 may extend a little above the final element of the projection system and the liquid level rises above the final element so that a buffer of liquid is provided. The liquid confinement structure 12 has an inner periphery that at the upper end, in an embodiment, closely conforms to the shape of the projection system or the final element thereof and may, e.g., be round. At the bottom, the inner periphery closely conforms to the shape of the image field, e.g., rectangular though this need not be the case.

The liquid is contained in the space 11 by a gas seal 16 which, during use, is formed between the bottom of the liquid confinement structure 12 and the surface of the substrate W. The gas seal is formed by gas, e.g. air or synthetic air but, in an embodiment, $N_2$ or another inert gas, provided under pressure via inlet 15 to the gap between liquid confinement structure 12 and substrate and extracted via outlet 14. The overpressure on the gas inlet 15, vacuum level on the outlet 14 and geometry of the gap are arranged so that there is a high-velocity gas flow inwards that confines the liquid. Those inlets/outlets may be annular grooves which surround the space 11 and the flow of gas 16 is effective to contain the liquid in the space 11. Such a system is disclosed in United States patent application publication no. US 2004-0207824, hereby incorporated in its entirety by reference.

Figure 6:
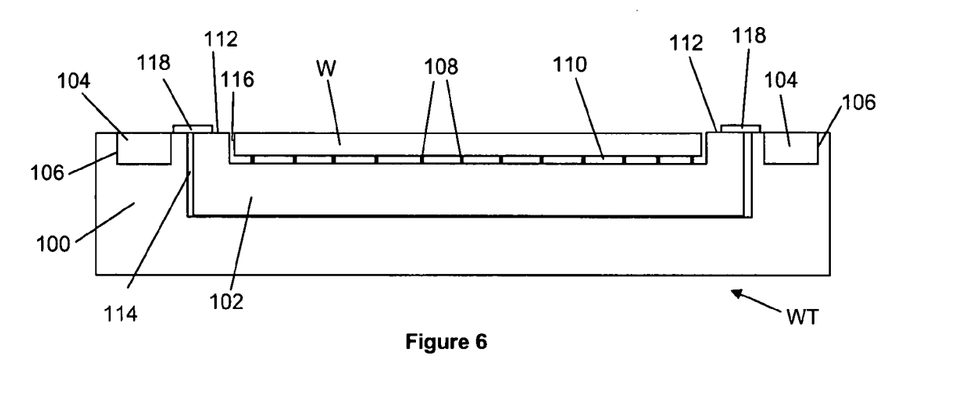
FIG. 6 depicts a substrate table of the lithographic apparatus to which an embodiment of the invention may be applied.

FIG. 6 shows schematically in cross section a substrate table WT. The substrate table WT comprises an outer portion 100 and a substrate receiving portion 102. A substrate W is present on the substrate receiving portion 102. One or more optical detectors and associated electronics 104 are provided in recess(es) 106 provided in the outer portion 100 of the substrate table WT. The substrate receiving portion 102 of the substrate table is provided with an array of protrusions 108 which protrude upwards from the substrate receiving portion.

The substrate W rests upon the protrusions 108. The protrusions 108 are dimensioned such that most, if not all, contamination particles rest between the protrusions and do not come into contact with the substrate W.

The substrate W is located in a recess 110 provided in the substrate receiving portion 102 of the substrate table WT. The recess 110 is dimensioned such that when a substrate is present an upper surface of the substrate W is substantially parallel with an upper surface of side(s) 112 of the substrate receiving portion 102.

In use, a substrate W is delivered to the substrate table WT by a substrate handler (not shown). A pattern is projected onto the substrate via the projection system PL (see FIGS. 1-4) of the lithographic apparatus. Once projection of the pattern has been completed, the substrate W is removed from the substrate table WT by the substrate handler, and is replaced by another substrate. The substrate receiving portion 102 generally remains in place in the outer portion 100 of the substrate table (i.e. it is not removed from the outer portion 100 during exposure operation of the lithographic apparatus).

A gap 114 is present between the substrate receiving portion 102 and the outer portion 100 of the substrate table. An additional gap 116 is present between an outer edge of the substrate W and the substrate receiving portion 102 of the substrate table WT. The gap between the substrate receiving portion 102 and the outer portion 100 of the substrate table may be closed for example by fixing adhesive plastic tape 118 over the gap. However, the same approach may not be used to close the gap 116 between the edge of the substrate W and the substrate receiving portion 102 of the substrate table WT, since it is necessary to be able to load and unload substrates from the substrate receiving portion during operation of the lithographic apparatus.

In an embodiment of the invention the gap 116 between the substrate and the substrate table is sealed using a seal that is capable of moving between open and closed configurations, thereby opening and closing the gap.

Figure 7:
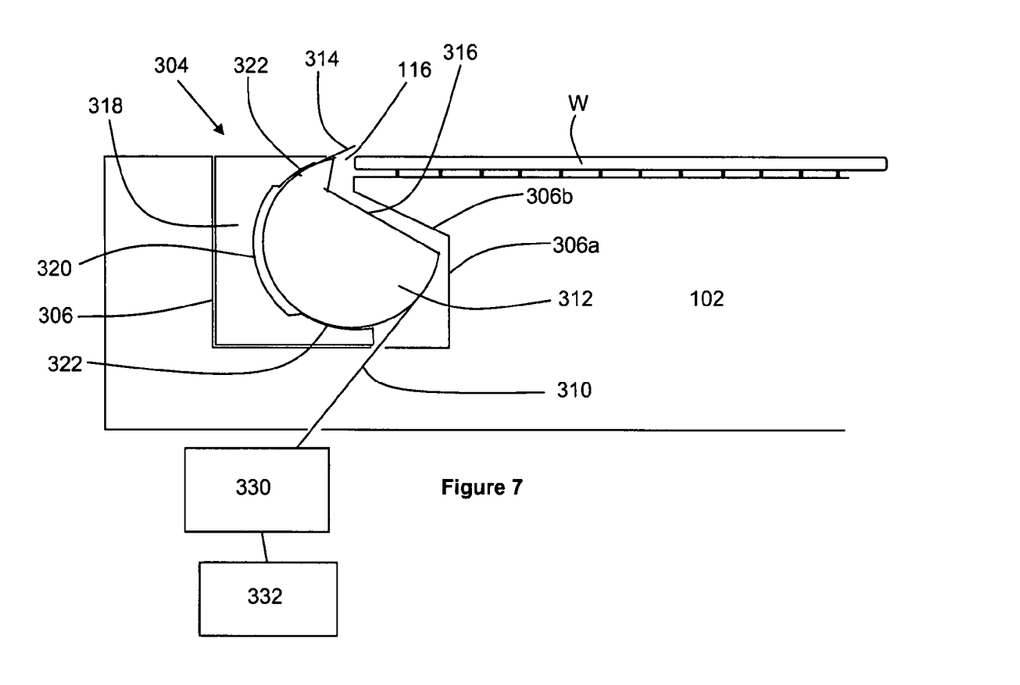
FIGS. 7 to 9 depict a seal according to an embodiment of the invention in situ in a substrate table of the lithographic apparatus.

FIG. 7 is a cross-sectional view of part of a substrate W, a substrate receiving portion 102 of a substrate table, and a seal 304 according to an embodiment of the invention.

The seal 304 is provided in a recess 306 formed in the substrate receiving portion 102 of the substrate table. In an embodiment, the recess may be in annular arrangement to the substrate when the substrate is on the substrate receiving portion 102.

The seal 304 comprises a ring 312 held in a guiding support structure 318 located in the recess 306. The ring 312 is partially circular in cross-section, but is provided with a lip 314 at an upper portion which can extend out of the gap 116 at an upper end of the recess 306. The lip may for example be 30 microns in cross-section or less, 25 microns in cross-section or less, or 20 microns in cross-section or less. A portion of the ring 312 adjacent to the lip may be flat in cross section, and will hereafter be referred to as the flat portion 316 of the ring.

The actuation mechanism comprises a sheet 310 (e.g., a flexible sheet) which is attached to the ring 312 at a location adjacent to the flat portion 316 of the ring. The sheet extends through an opening provided in a lowermost surface of the substrate receiving portion 102 of the substrate table. The sheet is connected to a motor 330 which is controlled by a controller 332. The controller 332 controls the motor 330 to pull the sheet 310 when desired. The controller 332 may also control the motor 330 to push the sheet 310 when desired. The motor 330 and controller 332 may be provided in the substrate table WT. Alternatively, either one or both of these may be provided elsewhere.

The ring 312 is held by the guiding support structure 318. The guiding support structure is dimensioned to fit into the recess 306 in the substrate receiving portion 102 of the substrate table. The guiding support structure 318 has a curved inner surface 320 which is configured to receive the ring 312. Upper and lower ends of the curved surface comprise contact points 322 which are configured to hold the ring. The contact points 322 may comprise a bearing, for example a gas bearing, an elastic bearing or other bearing. The guiding support structure 318 allows the ring 312 to rotate.

An inner portion of the recess 306 in the substrate receiving portion 102 of the substrate table includes a vertical wall 306a, and an upper wall 306b which tapers inwardly into the recess. The inwardly tapering upper wall 306b narrows the gap 116 between the substrate W and the substrate receiving portion 102 of the substrate table. The flat portion 316 of the ring 312 is located (at least partially) adjacent to the tapered upper wall 306b of the recess.

The ring 312 may be formed from an elastic material, for example a polymer. The elastic material may be resistant to DUV radiation. Alternatively, the material may be not resistant (or may be only partially resistant) to DUV. Where this is the case, some or all of the surface of the ring 312 may be coated with for example a DUV resistant film.

Figure 8A:
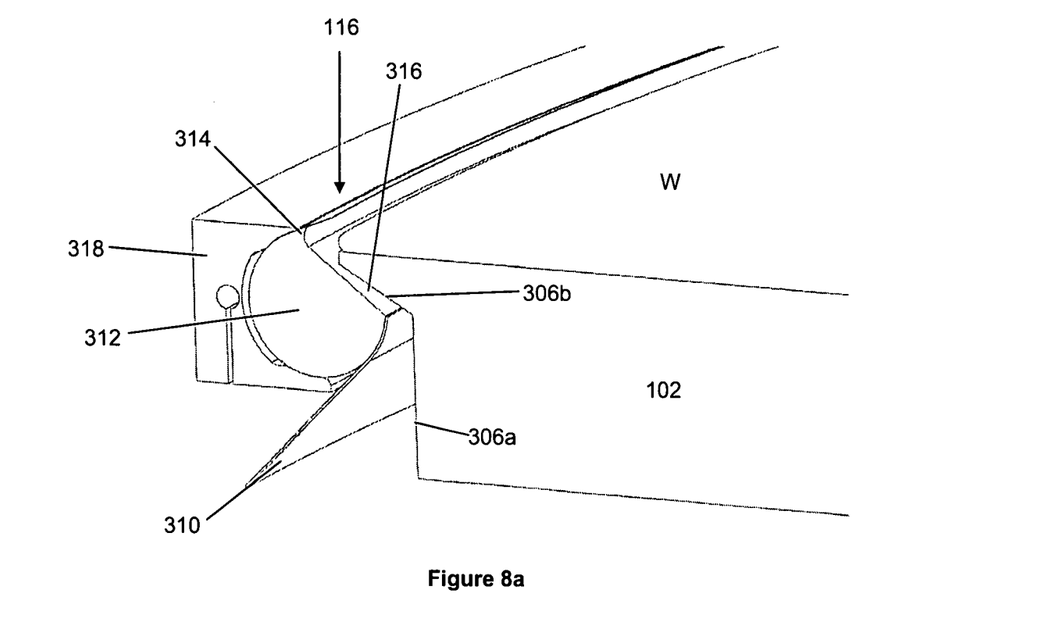
Figure 8B:
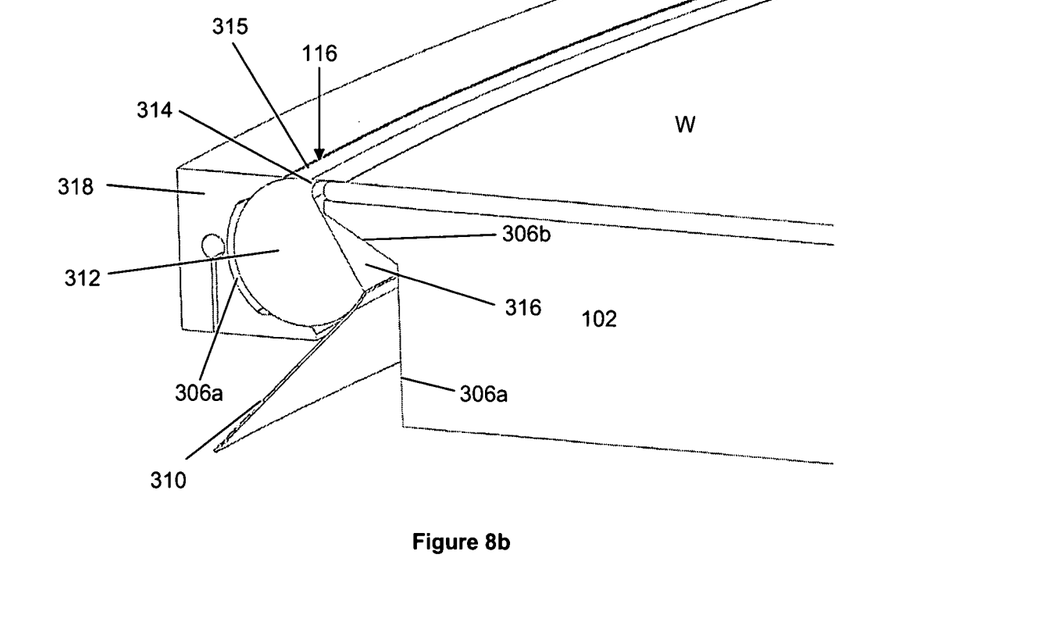

The ring 312 is able to rotate within the guiding support structure 318. Movement of the ring is illustrated in FIG. 8. The ring may be rotated from a first example configuration (shown in FIG. 8a) to a second example configuration (shown in FIG. 8b).

Figure 9A:
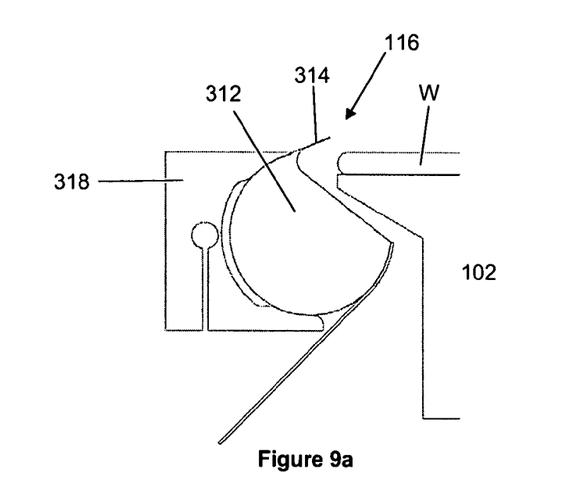

When the ring 312 is in the first configuration, the lip 314 extends upwards and out of the gap 116. This can be seen more clearly in FIG. 9a, which shows the substrate W, substrate receiving portion 102 of the substrate table, the ring 312 and the guiding support structure 318 in cross-section. In FIG. 9a the lip 314 extends out of the gap 116 and is not in contact with the substrate W. When the ring 312 is in the first configuration, the substrate W may be removed from the substrate table. The first configuration is referred to as the open configuration.

Figure 9B:
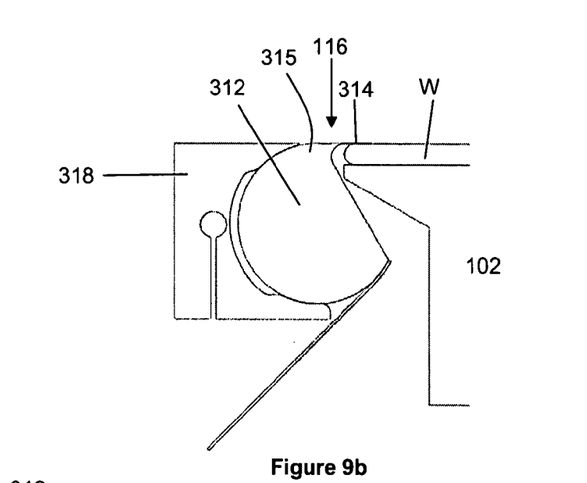

When the ring 312 has been rotated to the second configuration, the lip 314 moves such that, in combination with an exposed part of the ring 315, it closes the gap 116. The lip 314 may form a seal against the substrate W. This can be seen more clearly in FIG. 9b, in which the lip 314 contacts the upper surface of the substrate W. The second configuration is referred to as the closed configuration. The substrate W is desirably not removed from the substrate table when the ring is in the closed configuration, since the lip 314 overlaps the edge of the substrate W.

When the ring 312 is in the closed configuration, the lip 314 and the exposed part of the ring 315 have substantially closed the gap 116. This helps inhibit liquid used for immersion lithography from flowing into the gap 116. The flow of liquid into the gap 116 may force gas out of the gap and into the space 11 between a final element of the projection system PL and the substrate W (see FIG. 5). Where this happens, the gas may distort the pattern projected onto the substrate. Thus, substantially closing the gap 116 helps inhibit the liquid from flowing into the gap, helps inhibit gas from flowing into the space between the final element of the projection system and the substrate, and thereby helps to reduce distortion of the pattern projected onto the substrate. The risk of contamination passing into the liquid may also or alternatively be reduced.

A way of preventing liquid from entering the gap is by using a suitably positioned liquid extraction apparatus. This liquid extraction apparatus extracts liquid from around the substrate to prevent it from entering the gap, but in doing so causes evaporation of the liquid adjacent to the substrate. This may cool the substrate, causing distortion of the substrate which in turn compromises the accuracy with which the pattern may be projected onto the substrate. An embodiment of the invention does not cause localized cooling of the substrate, and therefore may avoid this disadvantage.

The lip 314 may be arranged such that the gap 116 is substantially sealed, such that no liquid flows into the gap. Alternatively, the lip may for example close the gap but not fully seal it, thereby reducing the flow of liquid into the gap 116 to such an extent that the liquid can be easily removed without difficulty (and avoiding the localized cooling problem mentioned above).

The lip 314 may be in contact with the substrate W, and may be arranged to press onto the substrate. However, the lip 314 does not necessarily have to be in contact with the substrate W in order for the lip to inhibit liquid from flowing into the gap 116.

A hydrophobic coating may be provided on the lip 314, for example on an underside of the lip. The hydrophobic coating may inhibit the flow of water (or other liquid used during immersion lithography) in the event that there is some separation between the lip 314 and the substrate W.

Rotation of the ring 312 is achieved by pulling or pushing the sheet 310. This may be achieved for example using the motor 330 (see FIG. 7). For example, if the ring is in the open configuration (shown in FIGS. 8a and 9a) then the sheet 310 may be pulled in order to move the ring to the closed configuration (shown in FIGS. 8b and 9b). Pulling force may continue to be applied to the sheet even after the ring 312 has been moved to the closed configuration. This may be done for example to bias the lip 314 onto the substrate W, such that the lip presses onto the substrate. This may help to substantially seal the gap 116, and thereby help prevent liquid from entering into the gap.

The sheet 310 may be pushed (for example by the motor) in order to move the ring 312 to the open configuration. In order to do this a sheet 310 should have sufficient rigidity to allow a pushing force applied to the flexible sheet to pass to the ring.

In use, the ring 312 is initially in an open configuration. A substrate W is placed onto the substrate receiving portion 102 of the substrate table WT. The controller 332 then causes the motor 330 to apply a pulling force to the sheet 310. This rotates the ring 312 to the closed configuration, such that the lip 314 and the exposed part of the ring 315 substantially close the gap 116 between the substrate W and the substrate receiving portion 102 of the substrate table. Lithographic projection of a pattern onto the substrate is then performed, with a liquid located between the projection system PL and the substrate W (i.e. immersion lithography). The liquid is inhibited from flowing into the gap 116 because the gap has been substantially closed.

In an embodiment, the lip 314 is 30 microns thick (or less). This is sufficiently thin that the movement relative to a liquid confinement structure is not compromised by the presence of the lip 314. In other words the liquid confinement structure does not come into contact with the lip during lithographic projection. In some instances it may be possible to provide a lip 314 which is thicker than 30 microns. In general, the lip 314 is sufficiently thin that it does not come into contact with a liquid confinement structure during lithographic projection.

The length of the lip 314 is such that the lip extends over an outer peripheral portion of the substrate W. The lip may for example be sufficiently long that it extends across the first 2 mm of the outer peripheral portion of the substrate (e.g. for a 300 mm diameter substrate). The lip may be sufficiently long that in use the lip extends at least as far as the flat portion of the substrate W (the edge of the substrate is curved, as shown in FIG. 9). The lip may be sufficiently long that in use the lip extends at least as far as a topcoat on the substrate. The lip may be sufficiently long that in use the lip extends beyond that part of the substrate which has undergone edge bead removal. Ensuring that the lip extends over an outer peripheral portion of the substrate may assist in reducing the amount of contamination which is introduced into the liquid, since contamination is often found at the peripheral portion of the substrate.

Once projection of the pattern onto the substrate has been completed, the controller 332 causes the motor 330 to cease applying the pulling force on the sheet 310 (or causes it to apply a pushing force). The ring 312 thus moves to an open configuration. The substrate W may then be removed from the substrate table WT. A new substrate may then be placed on the substrate table, and the process is repeated.

It is not essential that the ring 312 be rotated using a sheet. Any suitable actuation mechanism may be used, for example grooves (not shown) may be provided in the ring, the grooves being positioned to receive teeth of one or more rotatable cogs which may be used to rotate the ring. A plurality of wires, tapes or cords may be attached to the ring at different locations around the ring. The wires, tapes or cords may be flexible connectors Operation of the flexible connectors may be achieved in a similar manner to operation of a flexible sheet. For example, they may be actuated by a single motor or by a plurality of motors.

Figure 10:
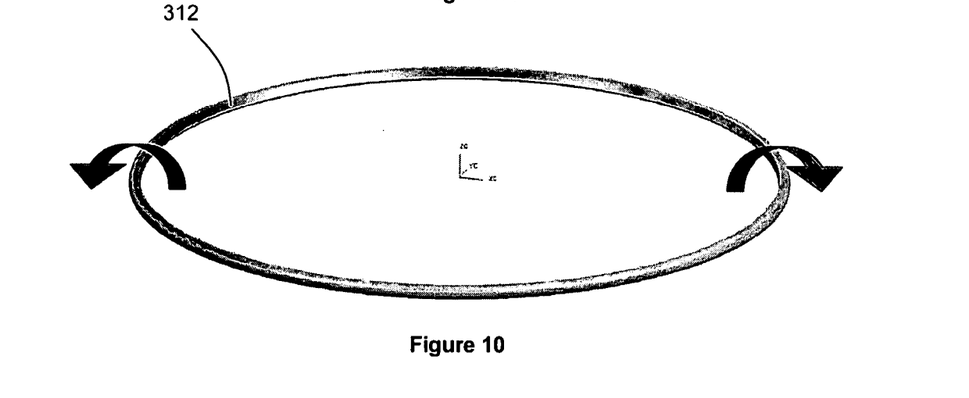
FIG. 10 depicts the seal.

FIG. 10 shows the ring 312 in isolation (i.e. without the substrate table, the substrate or the guiding support structure being shown). The rotation of the ring 312 is indicated by arrows.

The ring 312 may be formed such that it is inherently biased towards one configuration. For example, the ring 312 may be configured such that it is inherently biased towards an open configuration. This may be achieved for example by taking into account the resilient nature of the elastic material used when forming the ring 312. The ring may be for example formed using a mould which forms the ring 312 in the open configuration. Where this is done force must be applied to rotate the ring 312 towards the closed configuration, and to keep the ring in the closed configuration. Releasing the force will allow the ring to return to the open configuration.

It is not essential that the ring and/or a recess be circular, and it may be any other appropriate shape. However, it is desired that the ring extend around the substrate. It is not essential that the ring have a substantially circular cross-section, and it may have any other appropriate cross-sectional shape. However, it is desired that the ring have a cross-sectional shape which allows it to be actuated between open and closed configurations.

The guiding support structure 318 need not be a circular shape, and may be any other appropriate shape.

The ring need not continuously extend around the substrate. For example, it may be a multiple part structure each part of which acts to close a different part of the gap. There may be overlap between different parts of the structure.

The embodiments described herein may find application in other arrangements to selectively seal a gap between two structures, instead of or in addition to a gap between a substrate and a substrate table.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, where applicable, the invention may take the form of a computer program containing one or more sequences of machine-readable instructions describing a method as disclosed above, or a data storage medium (e.g. semiconductor memory, magnetic or optical disk) having such a computer program stored therein.

Although an embodiment of the invention has been described for an immersion lithography apparatus in which the liquid is applied to a localized surface area of the substrate, an embodiment of the invention may be applied to an immersion lithography apparatus in which the substrate or substrate and substrate table are immersed in a bath of liquid.

One or more embodiments of the invention may be applied to any immersion lithography apparatus, in particular, but not exclusively, those types mentioned above and whether the immersion liquid is provided in the form of a bath or only on a localized surface area of the substrate. A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The immersion liquid used in the apparatus may have different compositions, according to the desired properties and the wavelength of exposure radiation used. For an exposure wavelength of 193 nm, ultra pure water or water-based compositions may be used and for this reason the immersion liquid is sometimes referred to as water and water-related terms such as hydrophilic, hydrophobic, humidity, etc. may be used.

The descriptions above are intended to be illustrative, not limiting. Thus, it will be apparent to one skilled in the art that modifications may be made to the invention as described.

The invention claimed is:

1. A lithographic apparatus, comprising:
a substrate table arranged to hold a substrate;
a projection system configured to project a patterned beam of radiation onto the substrate;
a liquid supply system configured to provide a liquid to a space between the projection system and the substrate table;
a seal provided in the substrate table, the seal being actuatable from an open configuration to a closed configuration, the closed configuration being such that when a substrate is located on the substrate table, the seal substantially closes a gap between the substrate and the substrate table; and
a controller configured to rotate at least a portion of the seal from a position below a surface of the substrate to a position above the surface of the substrate.

2. The apparatus of claim 1, wherein the seal comprises a rotatable ring and a lip, wherein the ring and the lip are configured to substantially close the gap between the substrate and the substrate table when the seal is in the closed configuration.

3. The apparatus of claim 2, wherein the ring is substantially circular in cross-section.

4. The apparatus of claim 2, wherein the ring is made from an elastic material.

5. The apparatus of claim 4, wherein a DUV resistant film is provided on some or all of the surface of the ring.

6. The apparatus of claim 2, wherein the lip is sufficiently thin that it does not come into contact with a liquid confinement structure of the lithographic apparatus during lithographic projection.

7. The apparatus of claim 2, wherein the lip is 30 microns thick or less.

8. The apparatus of claim 2, wherein the seal further comprises a guiding support structure which supports the rotatable ring.

9. The apparatus of claim 8, wherein the guiding support structure is configured to support the ring with one or more bearings.

10. The apparatus of claim 8, wherein the guiding support structure is located in a recess in the substrate table.

11. The apparatus of claim 2, further comprising a flexible sheet or a plurality of flexible connectors, configured to apply force to the ring to cause it to rotate.

12. The apparatus of claim 11, further comprising a motor connected to the flexible sheet or the plurality of flexible connectors.

13. The apparatus of claim 2, wherein a hydrophobic coating is provided on the lip.

14. The apparatus of claim 2, wherein the lip is sufficiently long that in use the lip extends over a peripheral portion of the substrate.

15. The apparatus of claim 14, wherein the lip is sufficiently long that in use the lip extends beyond that part of the substrate which has undergone edge bead removal.

16. The apparatus of claim 2, wherein the ring extends in use around the substrate.

17. The apparatus of claim 2, wherein the ring comprises a plurality of parts.

18. The apparatus of claim 1, further comprising a controller arranged to cause the seal to move to the open configuration when a substrate is to be placed on the substrate table or removed from the substrate table, and to cause the seal to move to the closed configuration when a pattern is to be projected onto the substrate.

19. The apparatus of claim 1, wherein the seal is located in a recess in the substrate table.

20. The apparatus of claim 1, wherein the seal is configured to seal the gap between the substrate and the substrate table to prevent liquid from flowing into the gap.

21. A substrate table arranged to hold a lithographic substrate, a seal being provided in the substrate table and the seal having an end to face toward the substrate and an end to face toward the substrate table, the seal being actuatable from an open configuration to a closed configuration, such that, upon actuation, the seal has a rotational movement of and a lateral movement of both ends of the seal, the closed configuration being such that when a substrate is located on the substrate table, the seal substantially closes a gap between the substrate and the substrate table.

22. A lithographic method, comprising:
 providing a substrate on a substrate table;
 actuating a rotatable ring and a lip such that they rotate from a position below a surface of the substrate to a position above the surface of the substrate, and substantially close a gap between the substrate and the substrate table;
 providing a liquid to a space between a projection system and the substrate table;
 projecting a pattern onto the substrate via the projection system;
 actuating the rotatable ring such that the gap between the substrate and the substrate table is reopened; and
 removing the substrate from the substrate table.

* * * * *